United States Patent
Muray et al.

(10) Patent No.: US 8,115,168 B2
(45) Date of Patent: *Feb. 14, 2012

(54) LAYERED SCANNING CHARGED PARTICLE APPARATUS PACKAGE HAVING AN EMBEDDED HEATER

(75) Inventors: Lawrence P. Muray, Moraga, CA (US); James P. Spallas, Alamo, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 152 days.

This patent is subject to a terminal disclaimer.

(21) Appl. No.: 12/717,919

(22) Filed: Mar. 4, 2010

(65) Prior Publication Data
US 2010/0224778 A1 Sep. 9, 2010

Related U.S. Application Data

(60) Provisional application No. 61/157,210, filed on Mar. 4, 2009.

(51) Int. Cl.
*H01J 37/26* (2006.01)
*H01J 37/02* (2006.01)
*H01J 37/20* (2006.01)
*G01N 23/22* (2006.01)

(52) U.S. Cl. ........ 250/307; 250/310; 250/311; 250/397; 250/492.3

(58) Field of Classification Search .................. 250/306, 250/307, 309, 310, 311, 396 R, 396 ML, 250/297, 398, 423 R, 424, 492.1, 492.2, 492.3, 250/492.21, 494.1, 580
See application file for complete search history.

(56) References Cited

U.S. PATENT DOCUMENTS

| | | | |
|---|---|---|---|
| 5,122,663 A | 6/1992 | Chang et al. | |
| 5,155,412 A | 10/1992 | Chang et al. | |
| 6,003,952 A | 12/1999 | Smart et al. | |
| 6,077,417 A | 6/2000 | Lee et al. | |
| 6,288,401 B1 | 9/2001 | Chang et al. | |
| 7,109,486 B1* | 9/2006 | Spallas et al. | 250/311 |
| 7,335,895 B1* | 2/2008 | Spallas et al. | 250/396 R |
| 8,003,952 B2* | 8/2011 | Muray et al. | 250/396 R |
| 2007/0138404 A1* | 6/2007 | Frosien et al. | 250/398 |
| 2008/0054180 A1* | 3/2008 | Silver et al. | 250/307 |
| 2008/0217531 A1* | 9/2008 | Muray et al. | 250/307 |
| 2009/0020698 A1* | 1/2009 | Muto et al. | 250/310 |
| 2010/0224777 A1* | 9/2010 | Spallas et al. | 250/307 |
| 2010/0224779 A1* | 9/2010 | Indermuehle et al. | 250/307 |
| 2010/0294931 A1* | 11/2010 | Zarchin et al. | 250/310 |
| 2010/0294937 A1 | 11/2010 | Finch et al. | |

OTHER PUBLICATIONS

Lawrence P. Muray et al., "Advances in Arrayed Microcolumn Lithography," J. Vac. Sci. Technol. B, vol. 18, No. 6, Nov./Dec. 2000.
T.H.P. Chang et al., "Multiple Electron-Beam Lithography," Microelectronic Engineering 57-58 (2001) pp. 117-135.
Notice of Allowance dated Oct. 4, 2011 in U.S. Appl. No. 12/718,940.
Notice of Allowance dated Sep. 30, 2011 in U.S. Appl. No. 12/717,901.

* cited by examiner

*Primary Examiner* — Bernard E Souw

(57) ABSTRACT

A scanning charge particle apparatus includes a layered charged particle beam column package; a sample holder; and a heater, such as a resistive heater, in one of the layers of the package that conductively heats layers and/or components.

19 Claims, 4 Drawing Sheets

LAYERED SCANNING CHARGED PARTICLE APPARATUS PACKAGE HAVING AN EMBEDDED HEATER

PRIORITY REFERENCE TO PRIOR APPLICATIONS

This application claims benefit of and incorporates by reference U.S. patent application Ser. No. 61/157,210, entitled "Method for Reducing or Eliminating the Build up of Contamination on Critical Column Components and Surfaces," filed on Mar. 4, 2009, by inventors Lawrence P. Muray et al.

TECHNICAL FIELD

This invention relates generally to scanning electron microscopes (SEMs), and more particularly, but not exclusively, provides an apparatus and method for reducing contamination in a layer column (e.g., in miniature, table top, portable SEMs, etc.) using embedded resistive heaters.

BACKGROUND

Contamination during electron beam imaging and analysis in SEMs and similar devices comes primarily from a sample under test (SUT). When electrons bombard the sample, they cause materials from the sample to be ejected. These materials can have very long mean free paths in vacuum and therefore can deposit on surfaces located at great distances from their origin. The most common contamination is polymer that comes from samples containing photoresist or other resins common to integrated circuit processing. The lenses in a scanning electron microscope (SEM) are typically in line-of-site to the SUT and exposed to any ejected polymer. The lenses are typically held at high voltages and are immersed in a low energy electron cloud. When polymer, being a dielectric, deposits on these lenses and is exposed to these conditions, it charges and causes distortions. Eventually the electron beam column will need to be cleaned or replaced. The situation is more severe in low-vacuum or environmental SEMs where the vacuum pressure near the sample can be up to ~10 Torr.

Accordingly, a new apparatus and method are needed for reducing contamination in a SEM and other charged particle devices.

SUMMARY

Embodiments of the invention provide a method and apparatus for minimizing, reducing, and/or preventing the build up of contamination during normal usage and, alternatively, removing contamination during a scheduled preventive maintenance (PM) via embedded heaters. This assists in meeting the following criteria:

1. The lenses, apertures, deflectors, blankers, detectors or any other component (collectively called components) attached to the package are cleaned by conductive heating without the possibility of stray magnetic or electric potentials.

2. Electrical connections to one or more components for the purpose of raising the temperature of any component or of the layered column package are not required. No current is passed through any of the components to raise the temperature of that or any other component or of the layered column package.

3. Non-conductive components can be cleaned by this method.

4. The lenses apertures, deflectors, detectors or any other component attached to the package are be heated to a common and uniform temperature by a single heat source embedded in the layered column package minimizing the number of electrical interconnects and simplifying the design.

5. Conductive heating using heaters embedded in the package are effective over a wide range of vacuum environments including ultra-high vacuum and low-vacuum as typically used by environmental SEMs.

The temperature required to prevent the deposition of contamination or to remove contamination once it is deposited is determined experimentally and is specific to the contamination source. It is important to note that the column itself sets the maximum temperature that can be used to remove contamination. For example, many metals that are used for bonding will fail if exposed to temperatures significantly below their melting point. If epoxies are used, then the temperatures that they break down at must not be exceeded. Additionally, the coefficient of thermal expansion (CTE) mismatches could cause fatigue-induced failures if the interfaces are exercised too often.

In an embodiment, a scanning charged particle microscope comprises: a layered charged particle beam column package which supports lenses, deflectors, blankers, detectors and/or other components; a charged particle source, and a sample holder. A heater composed of resistive materials or elements, configured in a series or parallel configuration, is embedded in the layered charged particle beam column package.

In an embodiment, a method comprises: generating a charged particle beam; focusing the beam with a charged particle beam column onto a sample, the column having a layered charged particle beam column package; a sample holder holding the sample; and a heater embedded in one or more layers, in a series or parallel configuration, of the package; activating the embedded heater to approximately uniformly raise the temperature of the layered package and all attached components, scanning the beam over the sample; and detecting charged particles from the sample with the detector. The vacuum at the sample can range from near atmosphere to high vacuum conditions.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

The following description is provided to enable any person having ordinary skill in the art to make and use the invention, and is provided in the context of a particular application and its requirements. Various modifications to the embodiments will be readily apparent to those skilled in the art, and the principles defined herein may be applied to other embodiments and applications without departing from the spirit and scope of the invention. Thus, the present invention is not intended to be limited to the embodiments shown, but is to be accorded the widest scope consistent with the principles, features and teachings disclosed herein.

Embodiments of the invention use, in part, layered packaging technology (e.g., low temperature co-fired ceramic (LTCC) to build a package with embedded resistive heater elements located at strategic sites that are operated during column operation or during a scheduled maintenance to minimize or prevent the deposition of contamination. Embodiments of the invention use LTCC technology because high density interconnects are required. The resistive heaters are not in electrical contact with the component targeted for heating. The single heat source provides uniform heating of the entire package assembly, in one embodiment, including all the components attached to the layered package. Electrical connection to the lenses, deflectors, apertures, detectors, or any other component attached to the layered package is not required. The heating is conductive and will not cause distortions.

LTCC technology is an excellent vehicle to illustrate embodiments of the invention because it enables printing reliable, high-density interconnects in a compact package, new assembly procedures and techniques that will improve performance and lower costs, novel package designs that allow high-volume production and new devices and designs, and electronics and devices integration that reduce costs and improve performance. It should be noted that LTCC is one of a number of technologies that can be used to package an electron beam column Another embodiment uses polyimide technology which uses polyimide instead of ceramic to build up a multiple layer package. Embodiments of the invention can use all packaging technology alternatives, modifications, and variances.

Figure 1:
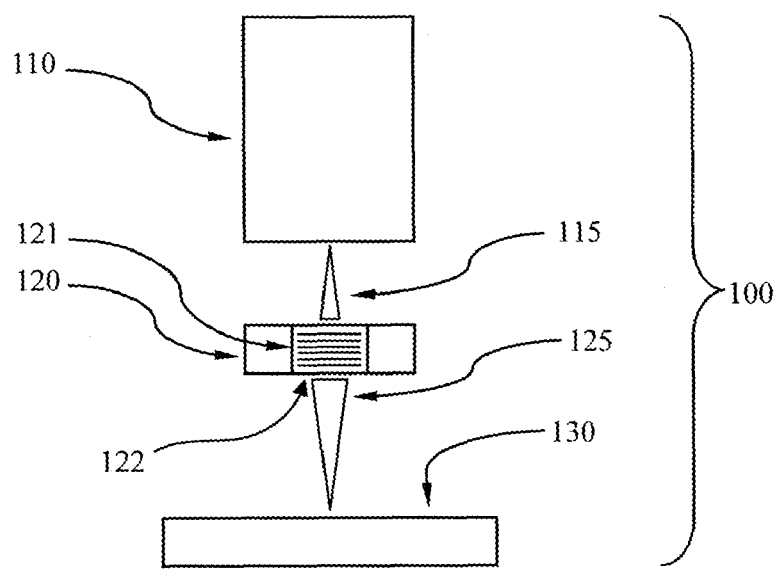
FIG. 1 is a block diagram illustrating an apparatus incorporating a charged particle column having a detector according to an embodiment of the invention.
Figure 2:
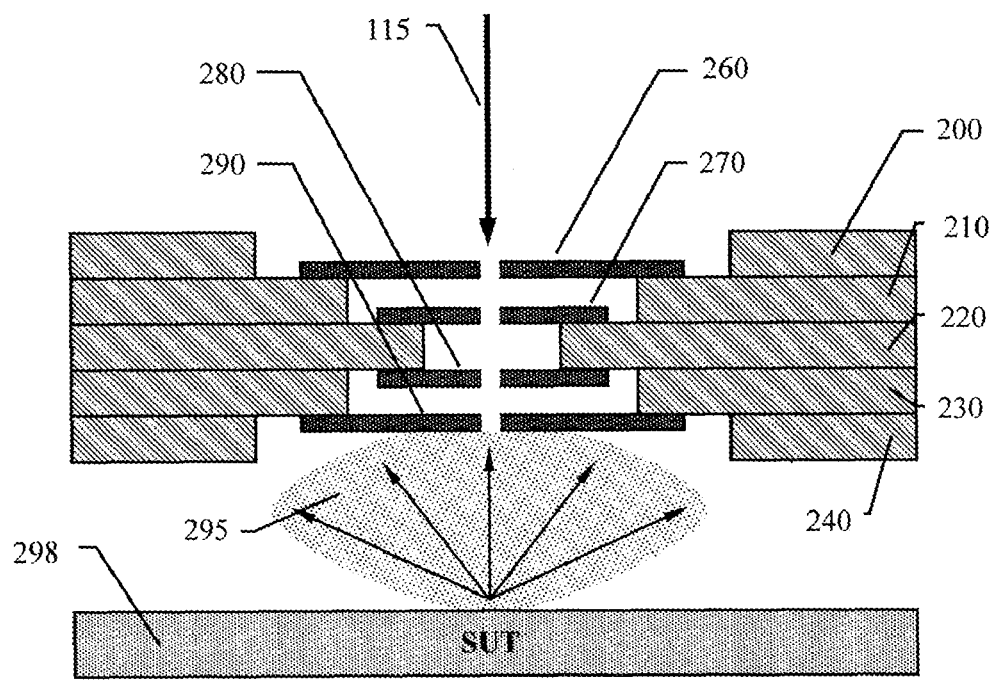
FIG. 2 is a cross section illustrating an electron beam column package according to an embodiment of the invention.

FIG. 1 is a block diagram illustrating an apparatus 100 incorporating, in this embodiment, a charged particle beam column package 120. In embodiments of the invention, the apparatus 100 includes scanning electron microscopes, lithography, inspection, and/or analysis tools. The apparatus 100 includes an electron or ion source 110, positioned adjacent to the beam column package 120, which supports lenses, deflectors, blankers, magnetic or electrostatic, and other elements required for the column operation (heretofore components 121). The package 120 and components 121 form the package assembly which is positioned adjacent to a sample holder 130 that holds the SUT 298 (FIG. 2). In an embodiment of the invention, the electron source 110 (cathode), such as a thermal field emitter (TFE), is positioned above the beam column package 120 and the sample holder 130 is positioned below the beam column package 120.

In an embodiment of the invention, the electron source 110 emits electrons 115 by field assisted thermionic emission. The electron source 110 can also comprise a Tungsten or $LaB_6$ filament, or any of a multitude of cold field emitters, including carbon nanotubes and microfabricated field emission tips. The electrons 115 can have an energy ranging from a few hundred eV to up to about 5 keV. The components 121 coupled to the beam column package 120 extract, collimate, and focus the electrons 115 into an electron beam 125, which is emitted from the package assembly as an electron beam 125. The package assembly scans the focused the beam 125 over the sample holder. In an embodiment in which the apparatus 100 includes a scanning electron microscope, the sample holder 130 holds an object for imaging. The electron beam 125 strikes the object causing the emission of electrons, some of which travel back to a detector 122, which are used to generate an image of the object.

During operation of the apparatus 100, resistive heater(s) can be turned on during scanning and/or maintenance to reduce and/or remove contamination from inside surfaces of the package 120 including components 121 and interior walls as will be discussed further below.

FIG. 2 is a cross section illustrating an electron beam column package 120 according to an embodiment of the invention. The beam column package 120 eliminates individually wired interconnects common to conventional scanning electron microscopes and lithography devices and replaces them with high density, batch-processed, printed circuitry. This is achieved using low temperature co-fired ceramic (LTCC) using, for example, materials from DuPont (e.g., 951 or 943) or Ferro (e.g., A6-S or A6-M), or high-temperature co-fired ceramic (HTCC) using, for example, materials from Kyocera, polyimide, or any other layering technology that produces a rigid package. The beam column package 120 is built layer-by-layer, up to 30 layers or more, and has interconnects strategically distributed on each layer using high-resolution pattern transfer, thereby yielding up to 60 surfaces or more for patterning and enabling the exposed surfaces to be reserved for termination pads for contact to flexible printed circuit (FlexPC) connectors or other high density interface. In contrast, miniature columns fabricated using alternative technologies have incorporated platforms or packages with significantly fewer surfaces for patterning. Each column package 120 is electrically tested and burned in before shipping, thereby improving yield and reducing infant mortality.

In an embodiment in which some or all of the components 121 are fabricated using silicon fabrication technologies or other materials, layered technology, such as LTCC technology, significantly reduces the complexity and fabrication time as well as increases reliability and yield of the lens elements. Isolating elements are incorporated in to the column package 120, thereby eliminating bonded glass spacers or other isolation elements that are individually attached to each lens or component before packaging.

Other advantages of using LTCC or HTCC technology include the ability to batch process and fabricate in high volume; fabrication at very low cost; packages with assembled components can be 100% electrically tested before shipping and are extremely reliable; packages provide a significant increase in real estate available for printed interconnects, ground planes, strip lines, matched impedance lines, embedded active and passive devices, external active and passive devices; and GHz drivers placed close to the components 121, packages are ultrahigh vacuum compatible; packages are rigid and durable; supporting low-loss high-speed interconnects (>1 GHz) because layered materials, such as LTCC, have low dielectric constants; supporting low-loss high-speed interconnects (>1 GHz) by enabling printing strip-lines and micro-strip-lines; hermetically sealing internal interconnections to prevent reliability failures and provide back to front vacuum isolation; lithographically printing interconnections with good resolution and registration; sufficient real estate for redundancy, scaling, or the addition of electronics or either passive (e.g., resistors, capacitors) or active devices; and FlexPC connectors can easily be integrated with the column.

The beam column package 120 comprises five layers 200-240 stacked one on top of another and four components 121, shown as 260-290 in FIG. 2. Each layer can have one or more components coupled to it (e.g., one per side). In an embodiment of the invention, the component 260 is coupled to a top surface of the layer 210; components 270 and 280 are coupled to a top and a bottom surface, respectively, of the layer 220; and the component 290 is coupled to a bottom surface of the layer 230. In an embodiment of the invention, the column package 120 can comprise a different number of layers and/or components. A component can include a single device like, for example, a silicon lens element, or a stack of devices like, for example, silicon lenses electrically isolated by an insulator like, for example, Pyrex. The number of devices in a stack not limited.

The top and bottom surface of the layers 200-240 are available for printed circuitry. Each electrical interconnect can be made to terminate at a pad on the top of the layer 200, the bottom of the layer 240, or any combination. Electrical connections between layers are made as needed by vias in the layers 200-240. Connection to external power supplies can be made using, for example, FlexPC connectors.

Pads can be printed on each layer 200-240 to allow each component 260-290 to be attached and made electrically connected using either manual techniques or production assembly techniques like, for example, a bump or ball bonding. Each component 260-290 of the column 120 is aligned and attached directly the column 120. The precise alignment needed can be done using marks printed on each component 260-290 and layer 200-240. The column 120 can have cutouts to view the marks and registration features when the assembly is completed to perform or verify alignment. Pads printed on of the topmost layer 200, bottommost layer 240, or on any other layer whereby a cutout is made to expose a surface can be used for attaching a FlexPC connector or other high density interface to the package using either manual techniques or production assembly techniques like, for example, a bump or ball bonding or soldering. Advantages of using this method may include: assembly is simpler, less labor intensive, and more reliable than other techniques used including anodic bonding and epoxy. This is because LTCC is a mature technology that allows batch processing, printed interconnects, and 100% electrical and mechanical testing of the components and subassemblies. The assembly can be done in high volume production using a variety of techniques. There is no contamination or other reliability problem. Layered processing achieves smooth, flat, and parallel surfaces for component attachment. The layer thickness is very well controlled. Electrical connection to a large number of pads is possible. LTCC, HTCC, and other layered process are compatible with lapping and polishing processes which can be used to create packages with extreme parallelism (TTV), flatness, and smoothness.

Each layer 200-240 can be made square shaped (or otherwise shaped) with one or more square, or otherwise, shaped cutouts to enable placement of a component, transmission of electrons, or other function. Components 260-290 may include discrete elements like lenses, deflectors, blankers, etc., or assemblies of elements such as fabricated lenses or deflector stacks. Layers can vary in thickness, for example from about 3.7 to about 8.2 mils for LTCC and significantly more for HTCC and polyimide processes. Each layer 200-240 can have the same thickness or their thicknesses can vary from each other.

The column package 120 has, in an embodiment, an hourglass shape designed to minimize the overall package size and maximize the real estate available for printed circuitry. The cutouts in each layer 210-220 decreases in at least one dimension from the top layer 200 and the bottom layer 240 to the center layer 220, which allows each component 260-290 access to its' corresponding layer. The minimum dimension of the cutout 250 is determined by the minimum practical size of component 270, the minimum required contact region at each layer, and the number of components.

During operation, the beam line 115 strikes the SUT 298 on the sample holder 130 causing the ejection of contamination 295 in a cosine distribution to deposit on the exposed surfaces of layers 230 and 240, component 290, and any other surfaces in line-of-site higher up in the column. Heating the component 290 and/or other components by conduction to a sufficiently high temperature can prevent the accumulation of contamination. Heating the components (260-290) by conduction to a less than sufficiently high temperature can reduce the rate of accumulation of contamination.

Embodiments of the invention prevent or minimize contamination from depositing on any surface. When resistive heaters are located in layer 230 and possibly in layer 240 in proximity to the SUT 298, then contamination 295 ejected is targeted at heated surfaces and does not adhere. If other heated elements are located on some or all of layers 200-220, then the contamination only has a line-of-site to heated elements and cannot adhere. Accordingly, heating the components by conduction prevents or minimizes contamination from depositing on any surface. This process is applicable to low-vacuum systems (SEM's, for example) as well as standard high-vacuum systems.

A sufficiently high temperature during operation will prevent the deposition of contamination. Operating at a lower temperature as dictated by the tolerance of the column will reduce the rate of accumulation of contamination and extend the time needed between maintenance. The resistive heaters can be operated with a constant current, a constant voltage, a constant power or as a part of a controlled feedback loop for constant temperature.

Figure 3:
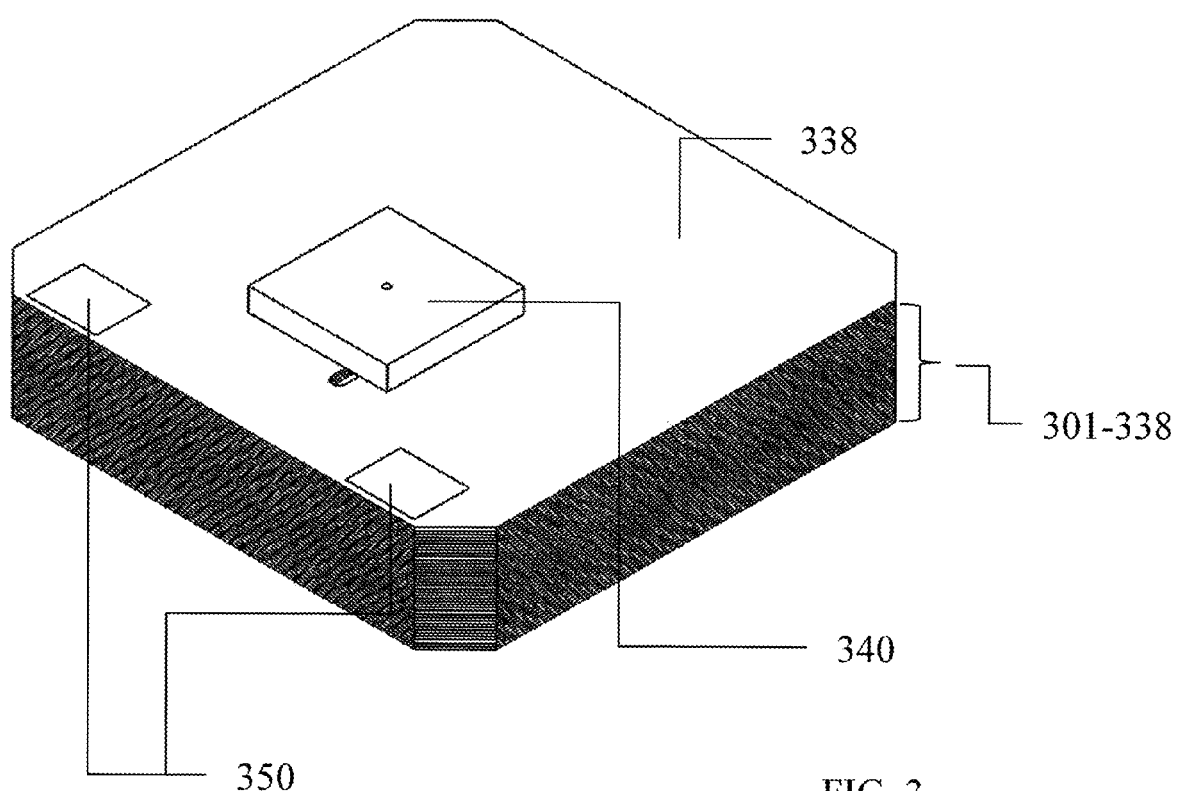
FIG. 3 is an isometric view illustrating a layered package with a lenses attached.

FIG. 3 is an isometric view of illustrating a layered column package 120 in an embodiment of the invention. The layered column package is comprised of 38 layers 301-338. A lens 340 is shown attached to layer 338. Pads 350 are printed onto layer 338 and provide electrical contact to the resistive heaters embedded in the package that in this embodiment are located on layers 327 and 328. In this embodiment, only two additional electrical connections are needed to implement this invention. Using the pads 350 to make electrical connection to the embedded resistive heaters, the package and, by conduction, all components attached to the package can be uniformly heated by passing current through resistive heaters. The resistive heaters can be calibrated so that by providing a specific current so that a corresponding specific temperature is reached.

Figure 4:
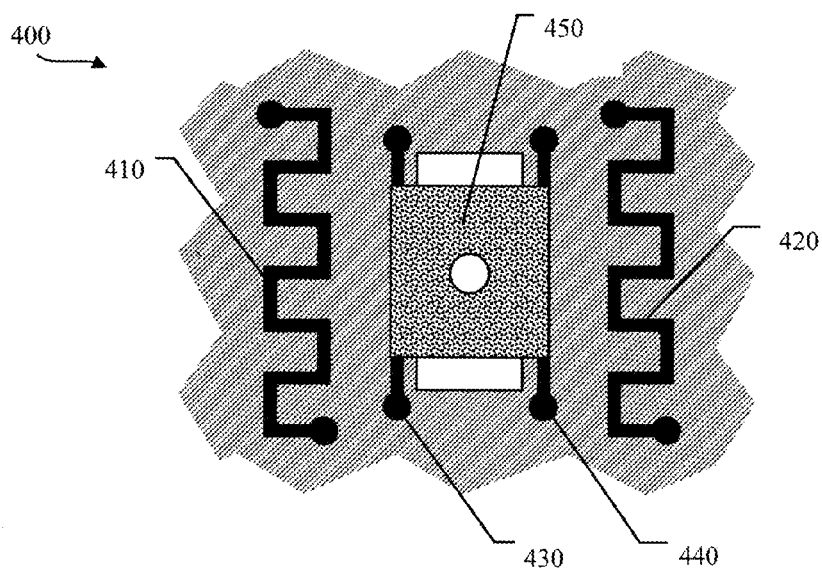
FIG. 4 is a plan view illustrating a layer incorporating resistive heaters.

FIG. 4 is a plan view illustrating a layer 400 incorporating resistive heaters 410 and 420. For illustrative purposed, the resistive heaters 410 and 420 are shown to be co-planar with the component. The component to be heated 450 is in electrical contact with an external component, for example, a power supply, by interconnects 430 and 440. The resistive heaters 410 and 420 are patterned in proximity to the component 450. In an embodiment, the layer 400 includes a single resistive heater 410 in only a portion of the layer 400. In another embodiment, the single heater 410 encircles the component 450. In another embodiment, multiple heaters 410 and 420 (or more) are symmetrically placed around the component 450 to evenly heat the layer 400 and/or component 450. In an embodiment, other types of heaters besides resistive heaters can be used in addition or in place of the resistive heaters 410 and 420.

In an embodiment, the layer 400 includes layer 230 and component 290. However, resistive heaters can be embedded on one or more or all the layers 200-240 of the package 120 to provide conductive heating for the layers 200-240 themselves, the lenses, deflectors, and/or any other component included in the column package 120.

The heaters may be operated continuously, pulsed or intermittently as required by the sample, the sample environment or other constraint. The heaters may further be part of a temperature control feedback loop, with temperature measured by a nearby thermocouple for example, and used to bring the ceramic and all the column components to a steady-state temperature.

Figure 5:
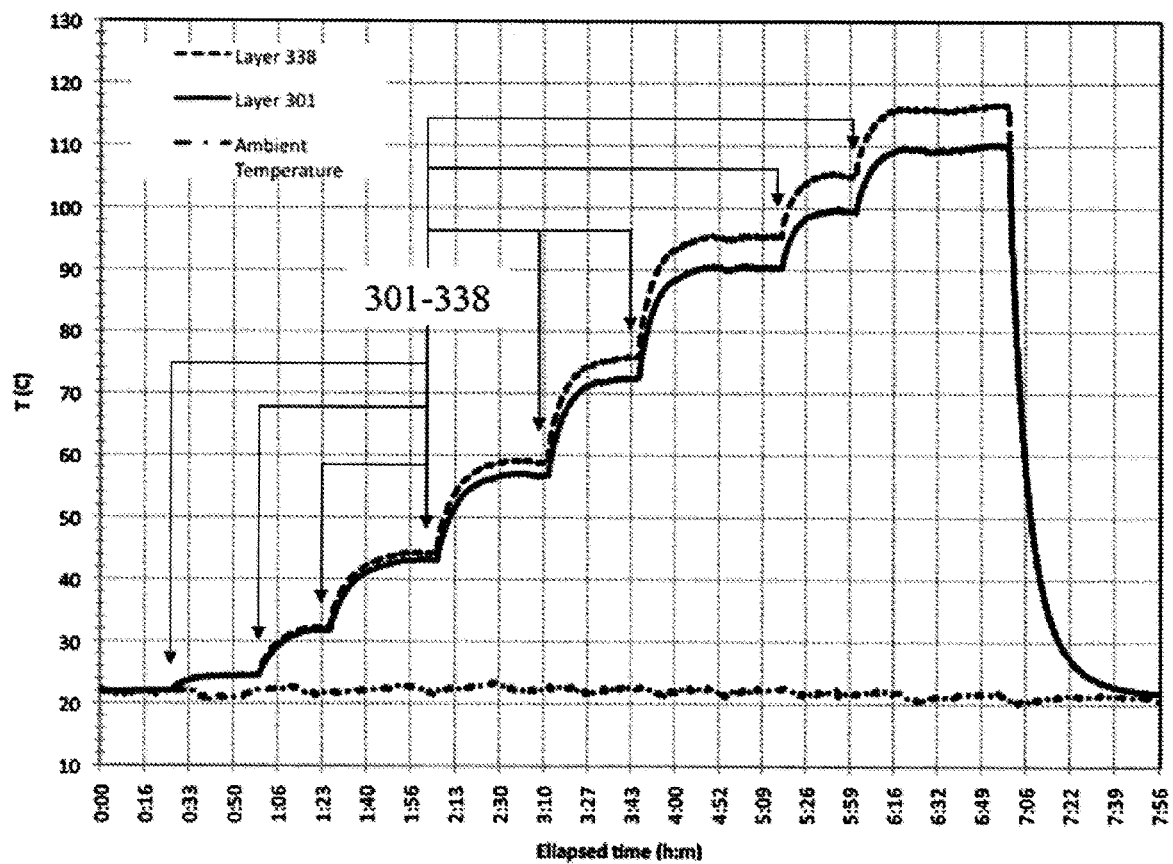
FIG. 5 is a graph illustrating a time dependent temperature rise and stabilization of the package as power is applied to the resistive heaters.

FIG. 5 is a graph illustrating a temperature response curve for a layered column package. The temperature is measured on layer 338 and layer 301. The ambient temperature is recorded for reference. Power is applied to the resistive heaters and the temperature is recorded. 501-508 show the temperature rise and stabilization for eight power set points. In each case, a constant voltage is applied and the temperature recorded at layers 338 and 301 over time. The voltage is held constant until the temperature on both layers stabilizes, then the voltage is increased and the process repeated. The test illustrated in FIG. 5 shows that a stabile temperature of about 117 C and about 111 C can be achieved on layers 338 and 301, respectively.

Figure 6:
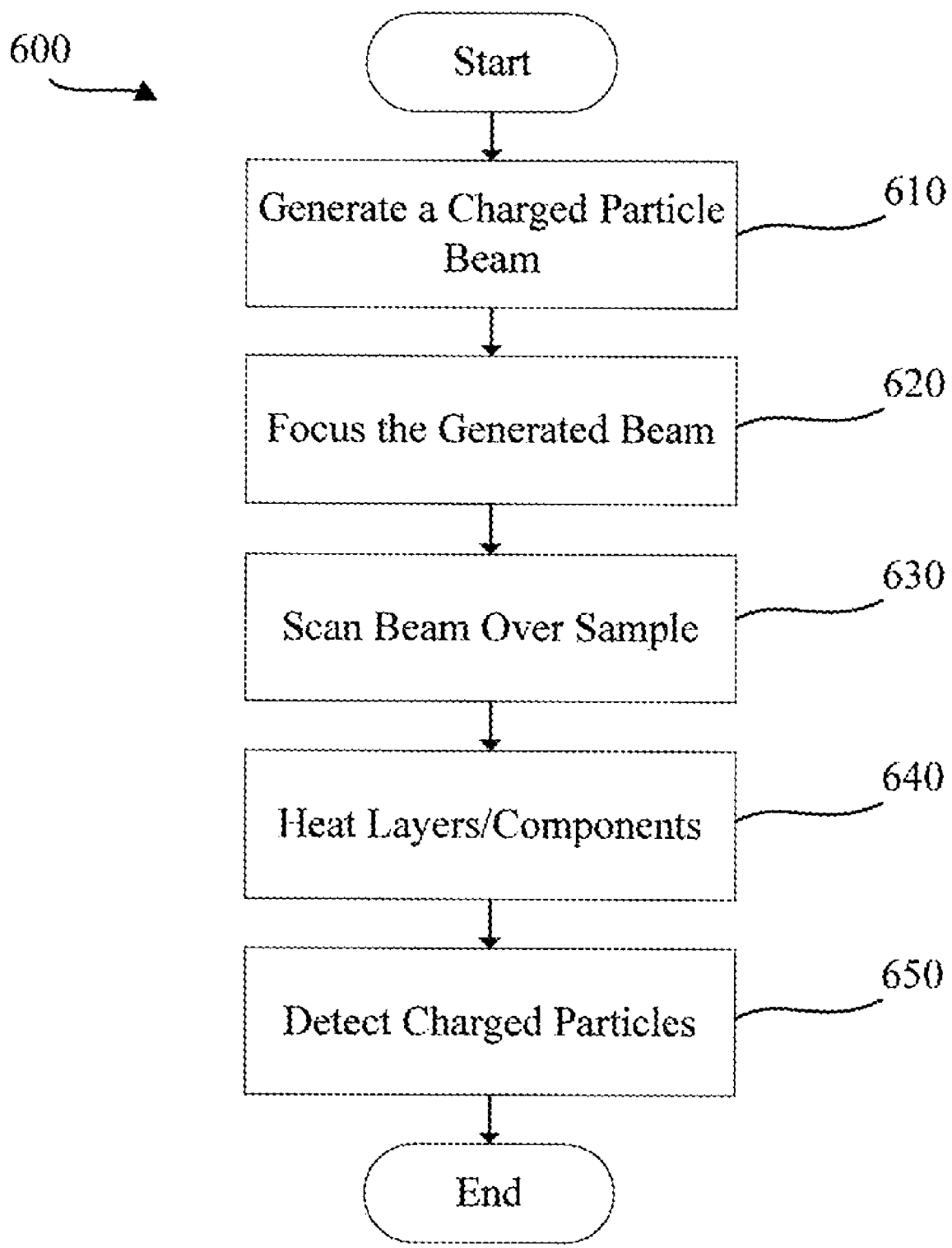
FIG. 6 is a flowchart illustrating a method of using the apparatus.

FIG. 6 is a flowchart illustrating a method 600 of using the apparatus 100. The method 600 comprises: generating (610) a charged particle beam; focusing (620) the beam with a charged particle beam column (e.g., the column 120) onto a sample; scanning (630) the beam over the sample; and detecting (650) charged particles from the sample with the detector to generate an image. The method 400 further comprises heating (640) components/layers with resistive heaters embedded in the layers either sequentially or concurrently with the other steps of the method 600. The components are heating conductively so as to not interfere with the beam 115. In another embodiment, the heating (640) is not done during regular operation of the apparatus but as certain regions may not be able to tolerate extended periods at the optimum temperature for prevention of accumulation of contaminants, for example, whenever in operation, but are able to tolerate short periods at temperature. In these cases the resistive heaters are used during preventative maintenance (PM) or when the system is in standby to remove the contamination accumulated during operation. Layer technology allows the strategic placement of heaters to clean any component that is prone to contamination via conductive heating.

The foregoing description of the illustrated embodiments of the present invention is by way of example only, and other variations and modifications of the above-described embodiments and methods are possible in light of the foregoing teaching. Further, components of this invention may be implemented using a programmed general purpose digital computer, using application specific integrated circuits, or using a network of interconnected conventional components and circuits. Connections may be wired, wireless, modem, etc. The embodiments described herein are not intended to be exhaustive or limiting. The present invention is limited only by the following claims.

What is claimed is:

1. A scanning charged particle apparatus, comprising:
   a layered charged particle beam column package having components for charged beam column operation;
   a sample holder; and
   a heater embedded in a layer of the column package.

2. The apparatus of claim 1, wherein the layers of the package are ceramic.

3. The apparatus of claim 2, wherein the package layers are made of LTCC or HTCC.

4. The apparatus of claim 1, further comprising additional heaters placed symmetrically around at least one of the components.

5. The apparatus of claim 1, further comprising additional heaters in other layers of the column package.

6. The apparatus of claim 1, wherein the heater is a resistive heater.

7. The apparatus of claim 1, wherein the heater is configured to heat individual components of the particle beam column via thermal conduction from the layered package thereby requiring no additional electrical connections.

8. The apparatus of claim 1, further comprising a temperature sensing device configured to close a feedback loop and set the temperature of the particle beam column.

9. The apparatus of claim 1, wherein the microscope includes a low-vacuum particle beam system.

10. A method, comprising:
    generating a charged particle beam;
    focusing the beam with a charged particle beam column onto a sample, the column having a layered charged particle beam column package with components for charged beam column operation; a sample holder holding the sample; and a heater embedded in a layer of the package;
    heating the layer with the embedded heater;
    scanning the beam over the sample; and
    detecting charged particles from the sample.

11. The method of claim 10, wherein the layers of the package are ceramic.

12. The method of claim 11, wherein the package layers are made of LTCC or HTCC.

13. The method of claim 10, wherein the column package further comprises additional heaters placed symmetrically around at least one of the components.

14. The method of claim 10, wherein the column package further comprises additional heaters in other layers of the column package.

15. The method of claim 10, further comprising heating a component with the heater.

16. The method of claim 10, wherein the heater is a resistive heater.

17. The method of claim 10, further comprising heating individual components of the particle beam column via thermal conduction from the layered package thereby requiring no additional electrical connections.

18. The method of claim 10, further comprising:
    sensing a temperature of the column; and
    setting, using the heater, a temperature of the column based on the sensing in a closed loop feedback manner.

19. The method of claim 10, wherein the method operates in a low-vacuum particle beam system.

* * * * *